(12) United States Patent
Lin et al.

(10) Patent No.: US 11,276,569 B2
(45) Date of Patent: Mar. 15, 2022

(54) ON STACK OVERLAY IMPROVEMENT FOR 3D NAND

(71) Applicant: Applied Materials, Inc., Santa Clara, CA (US)

(72) Inventors: Yongjing Lin, San Jose, CA (US); Tza-Jing Gung, San Jose, CA (US); Masaki Ogata, San Jose, CA (US); Yusheng Zhou, Sunnyvale, CA (US); Xinhai Han, Santa Clara, CA (US); Deenesh Padhi, Sunnyvale, CA (US); Juan Carlos Rocha, San Carlos, CA (US); Amit Kumar Bansal, Milpitas, CA (US); Mukund Srinivasan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 307 days.

(21) Appl. No.: 16/515,230

(22) Filed: Jul. 18, 2019

(65) Prior Publication Data
US 2020/0043723 A1 Feb. 6, 2020

Related U.S. Application Data

(60) Provisional application No. 62/712,729, filed on Jul. 31, 2018.

(51) Int. Cl.
*H01L 21/02* (2006.01)
(52) U.S. Cl.
CPC ...... *H01L 21/02164* (2013.01); *H01L 21/022* (2013.01); *H01L 21/02274* (2013.01)
(58) Field of Classification Search
CPC .............. H01L 21/02164; H01L 21/022; H01L 21/02274
See application file for complete search history.

(56) References Cited

U.S. PATENT DOCUMENTS

| 6,368,988 B1 | 4/2002 | Li et al. |
| 8,076,250 B1 | 12/2011 | Rajagopalan et al. |

(Continued)

FOREIGN PATENT DOCUMENTS

JP 2017157853 A 9/2017

OTHER PUBLICATIONS

International Search Report/Written Opinion issued to PCT/US2019/042489 dated Nov. 6, 2019.

*Primary Examiner* — Mohammad M Choudhry
(74) *Attorney, Agent, or Firm* — Patterson + Sheridan, LLP

(57) ABSTRACT

Embodiments described herein relate to manufacturing layer stacks of oxide/nitride (ON) layers with minimized in-plane distortion (IPD) and lithographic overlay errors. A method of forming a layer stack ON layers includes flowing a first silicon-containing gas, an oxygen-containing gas, and a first dilution gas. A RF power is symmetrically applied to form a first material layer of $SiO_2$. A second silicon-containing gas, a nitrogen-containing gas, and a second dilution gas are flowed. A second RF power is symmetrically applied to form a second material layer of $Si_3N_4$. The flowing the first silicon-containing gas, the oxygen-containing gas, and the first dilution gas, the symmetrically applying the first RF power, the flowing the second silicon-containing gas, the nitrogen-containing gas, and the second dilution gas, and the symmetrically applying the second RF power is repeated until a desired number of first material layers and second material layers make up a layer stack.

20 Claims, 6 Drawing Sheets

(56) References Cited

U.S. PATENT DOCUMENTS

| | | | |
|---|---|---|---|
| 8,741,394 B2 | 6/2014 | Haverkamp et al. | |
| 9,458,537 B2 | 10/2016 | Rajagopalan et al. | |
| 2006/0286818 A1* | 12/2006 | Wang | H01L 21/3185 438/791 |
| 2009/0020802 A1* | 1/2009 | Ma | H01L 29/40114 257/316 |
| 2012/0000093 A1 | 1/2012 | Choi et al. | |
| 2013/0171834 A1* | 7/2013 | Haverkamp | C23C 16/402 438/763 |
| 2013/0220410 A1* | 8/2013 | Haas | H01L 21/02274 136/256 |
| 2014/0002322 A1 | 8/2014 | Nguyen et al. | |
| 2015/0136325 A1* | 5/2015 | Ye | H01J 37/32091 156/345.28 |
| 2016/0000276 A1 | 1/2016 | Sadjadi et al. | |
| 2017/0069466 A1* | 3/2017 | Tran | H01J 37/32357 |

\* cited by examiner ated overlay errors. Therefore, there is a need in the art for an apparatus and methods of manufacturing layer stacks of ON layers with minimized IPD and improved lithographic overlay.

ON STACK OVERLAY IMPROVEMENT FOR 3D NAND

CROSS-REFERENCE TO RELATED APPLICATIONS

This application claims priority to U.S. Provisional Patent Application Ser. No. 62/712,729, filed on Jul. 31, 2018, which herein is incorporated by reference.

BACKGROUND

Field

Embodiments of the present disclosure generally relate to 3D NAND memory cell manufacturing processes. More particularly, embodiments of the present disclosure relate to apparatuses and methods of manufacturing layer stacks of oxide/nitride (ON) layers with minimized in-plane distortion (IPD) and lithographic overlay errors.

Description of the Related Art

Growing demands continue to drive the need for high-capacity, high performance computer memory devices with smaller geometries at lower costs. To this end, components of memory cells are stacked on top of each other to create three-dimensional (3D) memory cells, such as vertical gate 3D memory cells. One such technology is NAND flash memory, which is generally found in memory cards, USB flash drives, solid-state drives, and other similar devices for data storage and transfer. In NAND flash memory, memory cells made from transistors are connected in series and stacked in vertical layers to create densely-packed, high-capacity memory devices. Flash drives generally use less power and are more durable than ordinary hard drives because they do not contain moving parts. As such, there is great interest in increasing the capacity of flash drives.

As flash technology has progressed, challenges have continued to exist in how to create high-capacity devices on a small scale. One such challenge is that 3D NAND memory cells require 64× or more layer stacks of oxide/nitride (ON) layers that are subject to in-plane distortion (IPD) and lithographic overlay errors. Therefore, there is a need in the art for an apparatus and methods of manufacturing layer stacks of ON layers with minimized IPD and improved lithographic overlay.

SUMMARY

In one embodiment, a method of forming a layer stack of oxide/nitride (ON) layers is provided. The method includes transferring a substrate to a process chamber, heating a pedestal retaining the substrate to a deposition temperature, and flowing a first silicon-containing gas at a first silicon-containing gas flow rate, an oxygen-containing gas at an oxygen-containing gas flow rate, and a first dilution gas at a first dilution gas flow rate into the process chamber. A first radio frequency (RF) power is symmetrically applied to the first silicon-containing gas, the oxygen-containing gas, and the first dilution gas to form a first material layer of silicon dioxide ($SiO_2$). The method further includes flowing a second silicon-containing gas at a second silicon-containing gas flow rate, a nitrogen-containing gas at a nitrogen-containing gas flow rate, and a second dilution gas at a second dilution gas flow rate into the process chamber. A second RF power is symmetrically applied to the second silicon-containing gas, the nitrogen-containing gas, and the second dilution gas to form a second material layer of silicon nitride ($Si_3N_4$). The flowing the first silicon-containing gas, the oxygen-containing gas, and the first dilution gas, the symmetrically applying the first RF power, the flowing the second silicon-containing gas, the nitrogen-containing gas, and the second dilution gas, and the symmetrically applying the second RF power is repeated until a desired number of material layer pairs of the first material layer and the second material layer make up a layer stack.

In another embodiment, a method of forming a layer stack of oxide/nitride (ON) layers is provided. The method includes transferring a substrate to a first process chamber, heating a first pedestal of the first process chamber retaining the substrate to a deposition temperature, and flowing a first silicon-containing gas at a first silicon-containing gas flow rate, an oxygen-containing gas at an oxygen-containing gas flow rate, and a first dilution gas at a first dilution gas flow rate into the first process chamber. A first radio frequency (RF) power is symmetrically applied to the first silicon-containing gas, the oxygen-containing gas, and the first dilution gas to form a first material layer of silicon dioxide ($SiO_2$). The method further includes flowing a second silicon-containing gas at a second silicon-containing gas flow rate, a nitrogen-containing gas at a nitrogen-containing gas flow rate, and a second dilution gas at a second dilution gas flow rate into the first process chamber. A second RF power is symmetrically applied to the second silicon-containing gas, the nitrogen-containing gas, and the second dilution gas to form a second material layer of silicon nitride ($Si_3N_4$). The flowing the first silicon-containing gas, the oxygen-containing gas, and the first dilution gas, the symmetrically applying the first RF power, the flowing the second silicon-containing gas, the nitrogen-containing gas, and the second dilution gas, and the symmetrically applying the second RF power is repeated until a first portion of a desired number of material layer pairs of the first material layer and the second material layer make up a layer stack. The method further includes transferring the substrate from the first process chamber to a second process chamber, heating a second pedestal of the second process chamber retaining the substrate to the deposition temperature, and repeating the flowing the first silicon-containing gas, the oxygen-containing gas, and the first dilution gas, the symmetrically applying the first RF power, the flowing the second silicon-containing gas, the nitrogen-containing gas, and the second dilution gas, and the symmetrically applying the second RF power until a second portion of the desired number of the material layer pairs of the first material layer and the second material layer make up a layer stack.

In yet another embodiment, a showerhead is provided. The showerhead includes a symmetric radio frequency (RF) circuit disposed in the showerhead connected to a RF power source by a RF feed having a four portions connected to the symmetric RF circuit at 90 degree intervals.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to manufacturing layer stacks of oxide/nitride (ON) layers with minimized in-plane distortion (IPD) and lithographic overlay errors. A method of forming a layer stack ON layers includes flowing a first silicon-containing gas, an oxygen-containing gas, and a first dilution gas. A RF power is symmetrically applied to form a first material layer of $SiO_2$. A second silicon-containing gas, a nitrogen-containing gas, and a second dilution gas are flowed. A second RF power is symmetrically applied to form a second material layer of $Si_3N_4$. The flowing the first silicon-containing gas, the oxygen-containing gas, and the first dilution gas, the symmetrically applying the first RF power, the flowing the second silicon-containing gas, the nitrogen-containing gas, and the second dilution gas, and the symmetrically applying the second RF power is repeated until a desired number of first material layers and second material layers make up a layer stack.

Figure 1:
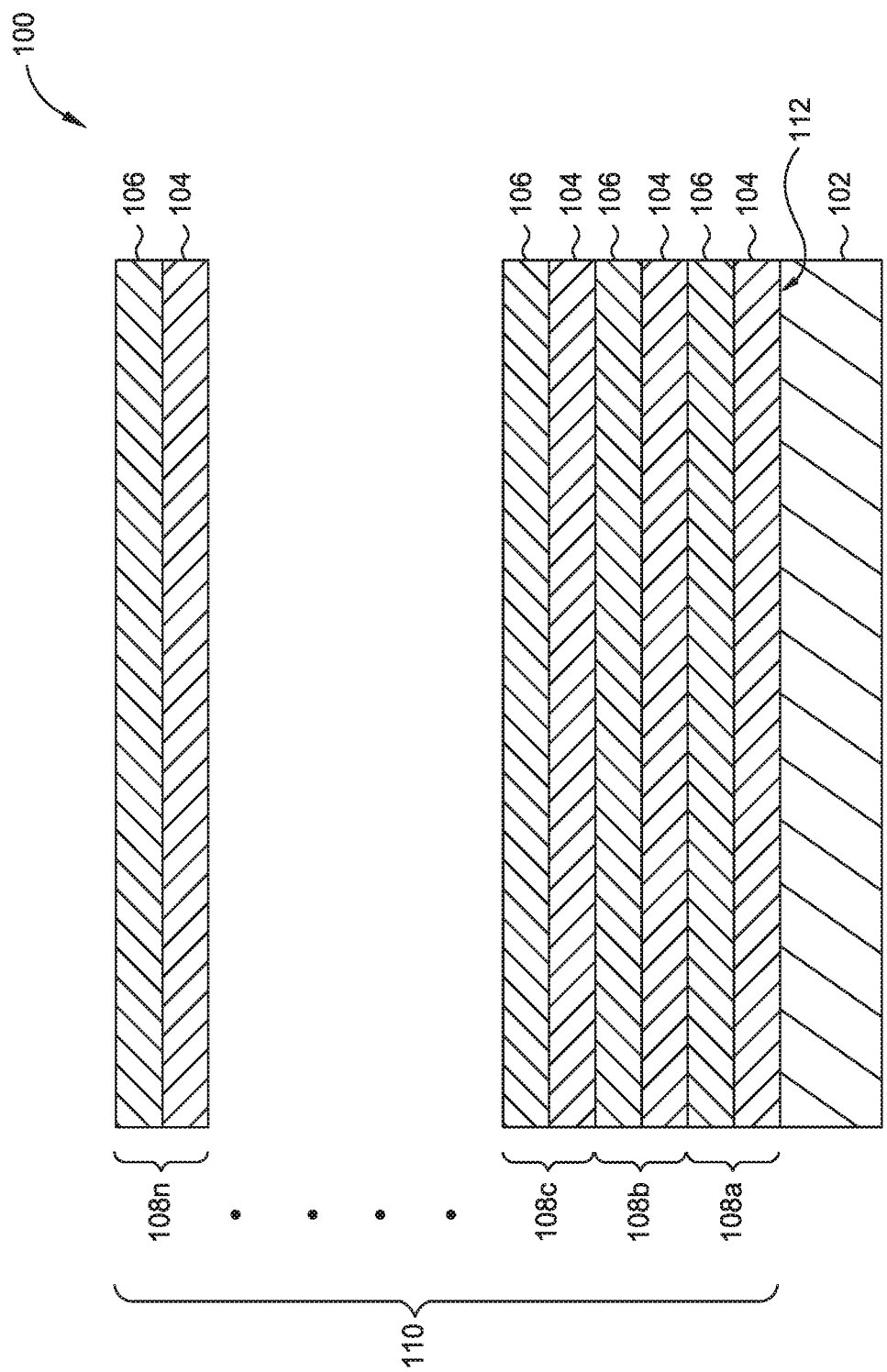
FIG. 1 is a schematic cross-sectional view of a memory device according to an embodiment.

FIG. 1 is a schematic cross-sectional view of a memory device 100 according to embodiments of the present disclosure. The memory device 100 includes a substrate 102 with a plurality of first material layers 104 and a plurality of second material layers 106 thereon. Material layer pairs 108a, 108b, 108c, . . . 108n, also known as a plurality of material layer pairs 108 of a first material layer of the plurality of first material layers 104 and a second material layer of the plurality of second material layers 106, make up a layer stack 110. In the embodiment of an ON stack memory device, each of the first material layers 104 is generally a silicon dioxide layer (O layer) and each of the second material layers 106 is generally a silicon nitride layer (N layer). While FIG. 1 depicts the second material layer 106 deposited over the first material layer 104, the deposition order may be reversed such that the first material layer 104 (O layer) is deposited over the second material layer 106 (N layer). In an embodiment in which the memory device 100 is a 3D NAND memory cell, the memory device 100 further includes a source and a drain (not shown) disposed on opposite ends of a first surface 112 of the substrate 102. For use as flash memory, multiple NAND flash cells are generally connected in series with the adjacent cells sharing a source or drain, and each cell is connected to a bitline and a wordline. In operation, each cell can store data, such as a "0" or "1," therein.

The methods of manufacturing layer stacks of ON/OP films with minimized IPD and improved lithographic overlay include plasma-enhanced chemical vapor deposition (PECVD) processes, which can be used to form silicon films at relatively low temperatures. The methods can be performed by one or more twin PECVD systems, such as a PRODUCER® plasma enhanced CVD (PECVD) system, available from Applied Materials, Inc. of Santa Clara, Calif. The PECVD systems may be incorporated into a processing system 200, available from Applied Materials, Inc. of Santa Clara, Calif. It is to be understood that the processing system described below is an exemplary processing system and other processing systems, including processing systems from other manufacturers, may be used with or modified to accomplish aspects of the present disclosure. It is to be understood that the PECVD system below is an exemplary PECVD system and other PECVD systems, including PECVD systems from other manufacturers, may be used with or modified to accomplish aspects of the present disclosure.

Figure 2:
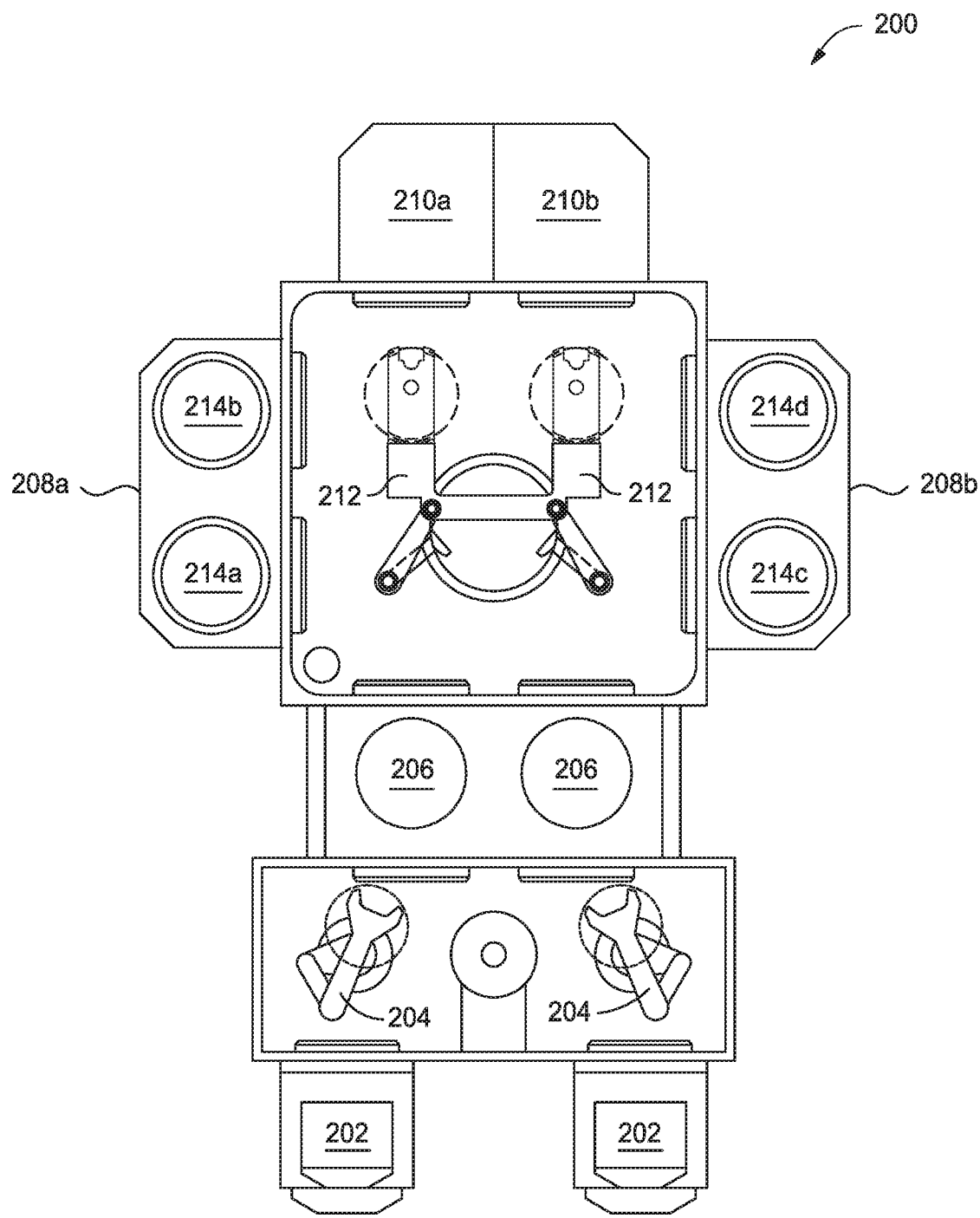
FIG. 2 is a schematic view of a processing system according to an embodiment.

FIG. 2 is a schematic view of a processing system 200 utilized for methods of manufacturing layer stacks of ON/OP layers with minimized IPD and improved lithographic overlay. As shown in FIG. 2, a pair of front opening unified pods (FOUPs) 202 supplies substrates that are received by robotic arms 204 and placed into the holding area 206 before being placed into one of the process chambers 214a-214d of PECVD systems 208a, 208b and/or Rapid Thermal Processing (RTP) chambers 210a, 210b. A second robotic arm 212 may be used to transport the substrates from the holding area 206 to the PECVD systems 208a-208d and/or RTP chambers 210a, 210b and back. The PECVD systems 208a, 208b are utilized to deposit ON/OP layer stacks and the RTP chambers 210a, 210b are utilized to anneal the ON/OP layer stacks.

Figure 3:
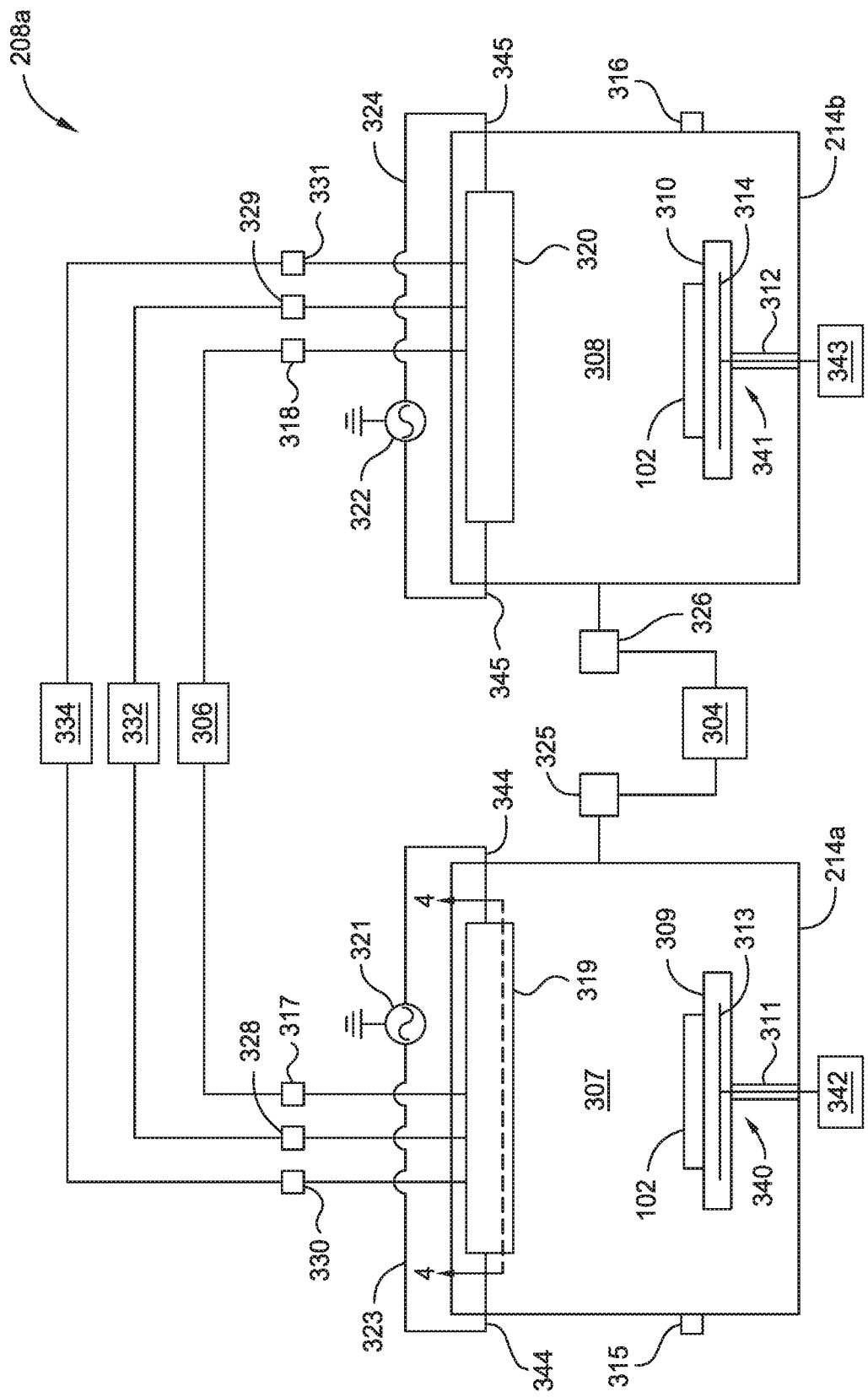
FIG. 3 is a schematic cross-sectional view of a plasma-enhanced chemical vapor deposition system according to an embodiment.

FIG. 3 is a schematic cross-sectional view of a PECVD system 208a utilized for methods of manufacturing layer stacks of ON/OP layers with minimized IPD and improved lithographic overlay. As shown in FIG. 3, the PECVD system 208a includes the process chambers 214a, 214b, wherein the process chambers 214a, 214b share resources, for example, such as a shared vacuum pump 304, a first gas source 306, a second gas source 332, and a third gas source 334. The process chamber 214a (e.g., a first process chamber) and the process chamber 214b (e.g., a second process chamber) are similarly configured.

Each process chamber 214a, 214b has a processing volume 307, 308 that includes a pedestal 309, 310 disposed therein to support a substrate 102. The pedestal 309, 310 includes a heating element (not shown) and a mechanism (not shown) that retains the substrate 102 on the pedestal 309, 310, such as an electrostatic chuck, a vacuum chuck, a substrate retaining clamp, or the like. The pedestal 309, 310 is coupled to and movably disposed in the processing volume 307, 308 by a stem 311, 312 connected to a lift system (not shown) that moves the pedestal 309, 310 between an elevated processing position and a lowered position that facilitates transfer of the substrate 102 to and from the process chamber 214a, 214b through an opening 315, 316.

A flow controller 317, 318, such as a mass flow control (MFC) device, is disposed between the first gas source 306 and the process chamber 214a, 214b to control a flow rate of a first process gas from the first gas source 306 to a showerhead 319, 320 used for distributing the first process gas across the processing volume 307, 308. A flow controller 328, 329 is disposed between the second gas source 332 and the process chamber 214a, 214b to control a flow rate of a second process gas from the second gas source 332 to a showerhead 319, 320 used for distributing the second process gas across the processing volume 307, 308. A flow controller 330, 331 is disposed between the third gas source 334 and the process chamber 214a, 214b to control a flow rate of a third process gas from the third gas source 334 to a showerhead 319, 320 used for distributing the third process gas across the processing volume 307, 308. A valve 325, 326 can be disposed between the shared vacuum pump 304 and the process chamber 214a, 214b for controlling the pressure within the processing volume 307, 308.

The showerhead 319, 320 includes a symmetric radio frequency (RF) circuit (shown in FIG. 4) connected to a RF power source 321, 322 by a RF feed 323, 324 having a plurality of portions 344, 345 for striking a substantially uniform plasma in the processing volume 307, 308 from the process gas. The pedestal 309, 310 includes a bottom tuner assembly 340, 341. The bottom tuner assembly 340, 341 includes a tuning electrode 313, 314 coupled to a tuning circuit 342, 343. The tuning circuit 342, 343 is utilized to modulate the impedance on the tuning electrode 313, 314 provide further control of the plasma in the processing volume. For example, modulating the impedance of the tuning electrode 313, 314 increases plasma bombardment on the substrate 102.

Figure 4:
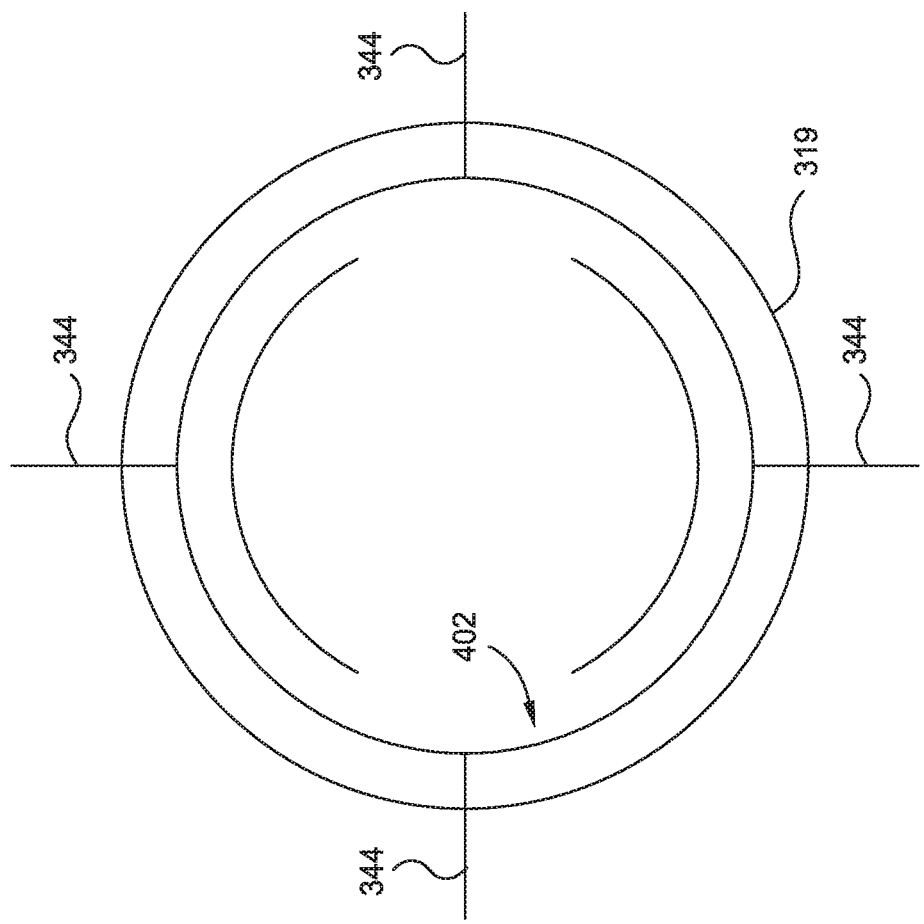
FIG. 4 is a top, schematic cross-sectional view of a showerhead of a process chamber according to an embodiment.

As shown in FIG. 4, a cross-sectional top view of the showerhead 319 of the process chambers 214a. The showerhead 319 has a symmetric RF circuit 402 disposed therein coupled to the RF feed 323. Each portion of the plurality of portions 344 is connected to the symmetric RF circuit 402 so that the supply of RF power to the symmetric RF circuit 402 is symmetric. For example, the RF feed 323 has four portions connected to the symmetric RF circuit 402 at 90 degree intervals. A symmetric supply of RF power to the symmetric RF circuit 402 allows for striking the substantially uniform plasma in the processing volume 307. The symmetric RF circuit 402 is symmetric so the plasma in the processing volume 307 is substantially uniform to reduce IPD of the layer stacks of ON layers.

Figure 5:
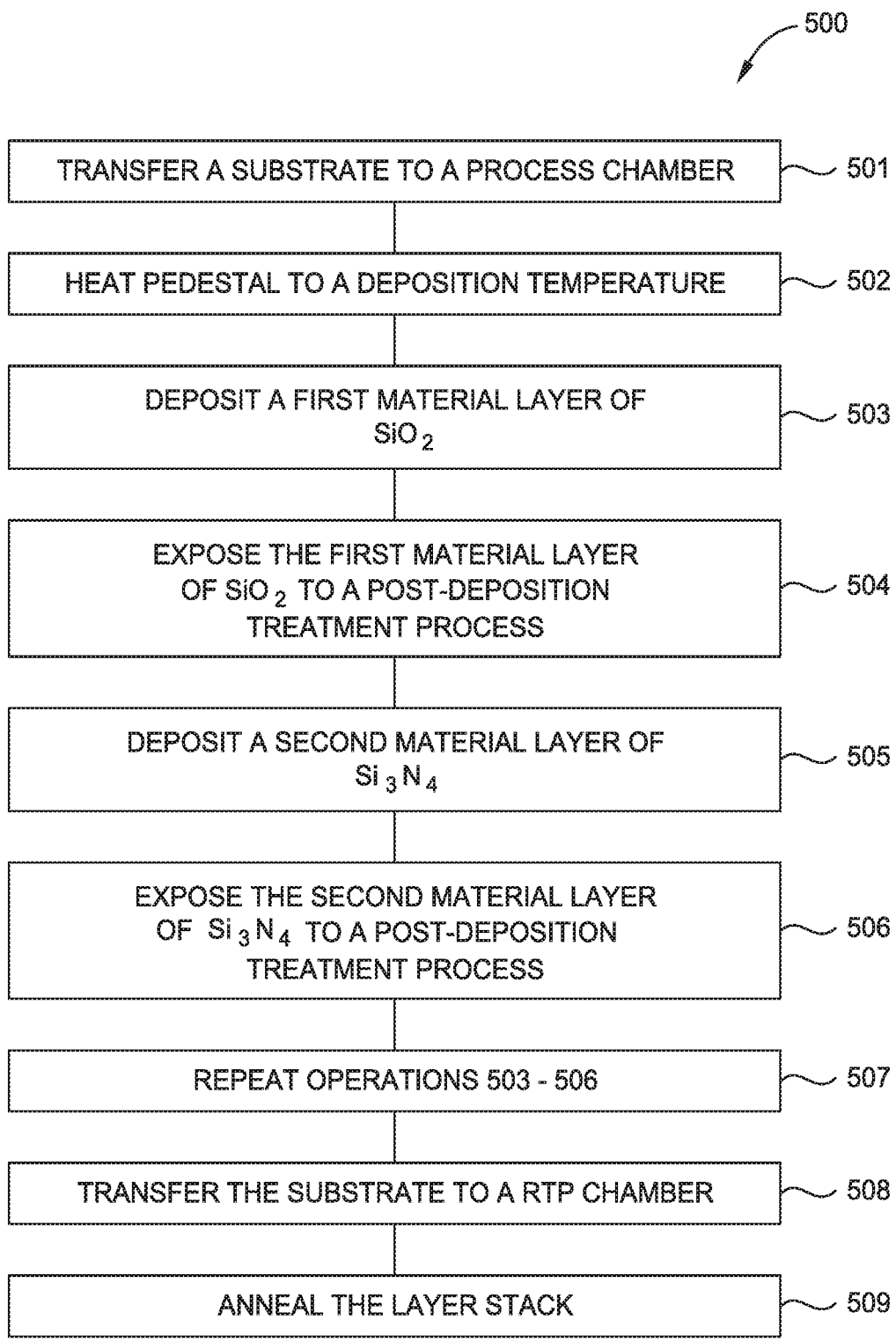
FIG. 5 is a flow diagram of a method of forming a layer stack of ON layers with minimized IPD and improved lithographic overlay according to an embodiment.

FIG. 5 is a flow diagram of a method 500 of forming a layer stack of ON layers with minimized IPD and improved lithographic overlay. At operation 501, a substrate 102 is transferred to a process chamber 214a of a PECVD system 208a. In one embodiment, a second robotic arm 212 transfers the substrate 102 from the holding area 206 of the processing system 200 to a process chamber 214a of the PECVD system 208a. At operation 502, the pedestal 309 is heated to a deposition temperature of about 500 degrees Celsius (° C.) to about 600° C. At operation 503, a first material layer 104 of silicon dioxide ($SiO_2$) is deposited. During operation 503, a first silicon-containing gas at a first silicon-containing gas flow rate, an oxygen-containing gas at an oxygen-containing gas flow rate, and a first dilution gas at a first dilution gas flow rate are delivered to the process chamber 214a.

In one embodiment, the flow controller 317 disposed between the first gas source 306 and the process chamber 214a controls the first silicon-containing gas flow rate of the first silicon-containing gas provided to showerhead 319 that distributes the first silicon-containing gas across the processing volume 307 of the process chamber 214a. The first silicon-containing gas may include at least one of silane ($SiH_4$), tetraethyl orthosilicate (TEOS), and disilane ($Si_2H_6$).

In another embodiment, the flow controller 328 disposed between the second gas source 332 and the process chamber 214a controls the oxygen-containing gas flow rate of the oxygen-containing gas provided to showerhead 319 that distributes the oxygen-containing gas across the processing volume 307 of the process chamber 214a. The oxygen-containing gas may include at least one of nitrous oxide ($N_2O$), oxygen gas ($O_2$), and trioxygen ($O_3$). In yet another embodiment, the flow controller 330 disposed between the third gas source 334 and the process chamber 214a controls the first dilution gas flow rate of the first dilution gas provided to showerhead 319 that distributes the first dilution gas across the processing volume 307 of the process chamber 214a. The first dilution gas may include at least one of nitrogen gas ($N_2$), argon (Ar), and helum (He). In some embodiments, the first silicon-containing gas flow rate is about 600 standard cubic centimeters per minute (sccm) to about 5000 sccm, the oxygen-containing gas flow rate is about 500 sccm to about 15000 sccm, and the first dilution gas flow rate is about 100 sccm to about 20000 sccm.

During the deposition of the first material layer 104 of $SiO_2$, a first RF power is applied to the first silicon-containing gas, the oxygen-containing gas, and the first dilution gas. In one embodiment, the showerhead 319 having a symmetric RF circuit 402 disposed therein connected to a RF power source 321 by a RF feed 323 having a plurality of portions 344 to allow for a symmetric application of the first RF power. Each portion of the plurality of portions is connected to the symmetric RF circuit 402 so that the supply of RF power to the symmetric RF circuit 402 is symmetric. A symmetric application of the first RF power allows for deposition of the first material layer 104 of $SiO_2$ with improved residual uniformity to minimize IPD and improve lithographic overlay of the layer stack 110 of ON layers. In one embodiment, IPD of the layer stack 110 of ON layers is reduced by 10 percent.

In one embodiment, the first material layer 104 is exposed to a post-deposition treatment process. At optional operation 504, after the deposition of the first material layer 104 of $SiO_2$, the flow of the first silicon-containing gas is discontinued, and the flow of the oxygen-containing gas and the flow of the first dilution gas are continued. The flow of the first silicon-containing gas is discontinued, and the flow of the oxygen-containing gas and the flow of the first dilution gas are continued to stabilize the plasma. The tuning circuit 342 of the bottom tuner assembly 340 is utilized to modulate the impedance on the tuning electrode 313 to increase bombardment of the remaining plasma in the processing volume 307 on the substrate 102. Increasing bombardment of the remaining plasma in the processing volume 307 on the substrate 102 reduces the stress non-uniformity of the first material layer 104. Reducing the stress non-uniformity of the first material layer 104 minimizes IPD and improves lithographic overlay of the layer stack 110 of ON layers.

At operation 505, a second material layer 106 of silicon nitride ($Si_3N_4$) is deposited. During operation 505, a second silicon-containing gas at a second silicon-containing gas flow rate, a nitrogen-containing gas at a nitrogen-containing gas flow rate, and a second dilution gas at a first dilution gas flow rate are delivered to the process chamber 214a.

In one embodiment, the flow controller 317 disposed between the first gas source 306 and the process chamber 214a controls the second silicon-containing gas flow rate of the second silicon-containing gas provided to showerhead 319 that distributes the second silicon-containing gas across the processing volume 307 of the process chamber 214a. The second silicon-containing gas may include at least one of SiH$_4$ and Si$_2$H$_6$. In another embodiment, the flow controller 328 disposed between the second gas source 332 and the process chamber 214a controls the nitrogen-containing gas flow rate of the nitrogen-containing gas provided to showerhead 319 that distributes the nitrogen-containing gas across the processing volume 307 of the process chamber 214a. The nitrogen-containing gas may include at least one of ammonia (NH$_3$) and N$_2$. In yet another embodiment, the flow controller 330 disposed between the third gas source 334 and the process chamber 214a controls the second dilution gas flow rate of the second dilution gas provided to showerhead 319 that distributes the second dilution gas across the processing volume 307 of the process chamber 214a. The second dilution gas may include at least one of N$_2$, Ar, and He. The second dilution gas flow rate is selected to improve the residual uniformity of the second material layer 106 of Si$_3$N$_4$ and reduce IPD by 50 percent. In one embodiment, the second dilution gas is N$_2$ and the second dilution gas flow rate is greater than about 2000 sccm. Increasing the flow of N$_2$ or Ar may improve the plasma uniformity during deposition to reduce IPD. In some embodiments, the second silicon-containing gas flow rate is about 30 standard cubic centimeters per minute (sccm) to about 300 sccm, the nitrogen-containing gas flow rate is about 200 sccm to about 7000 sccm, and the first dilution gas flow rate is about 500 sccm to about 3000 sccm.

During the deposition of the second material layer 106 of Si$_3$N$_4$, a second RF power is applied to the second silicon-containing gas, the nitrogen-containing gas, and the second dilution gas. In one embodiment, the showerhead 319 having the symmetric RF circuit 402 disposed therein is connected to the RF power source 321 by the RF feed 323 to allow for a symmetric application of the second RF power. A symmetric application of the second RF power allows for deposition of the second material layer 106 of Si$_3$N$_4$ with improved residual uniformity to minimize IPD and improve lithographic overlay of the layer stack 110 of ON layers.

In one embodiment, the second material layer 106 is exposed to a post-deposition treatment process. At optional operation 506, after the deposition of the second material layer 106 of Si$_3$N$_4$, the flow of the second silicon-containing gas is discontinued, and the flow of the nitrogen-containing gas and the flow of the second dilution gas are continued. The flow of the second silicon-containing gas is discontinued, and the flow of the nitrogen-containing gas and the flow of the second dilution gas are continued to stabilize the plasma. The tuning circuit 342 of the bottom tuner assembly 340 is utilized to modulate the impedance on the tuning electrode 313 to increase bombardment of the remaining plasma in the processing volume 307 on the substrate 102. Increasing bombardment of the remaining plasma in the processing volume 307 on the substrate 102 reduces the stress non-uniformity of the first material layer 104. Reducing the stress non-uniformity of the first material layer 104 minimizes IPD and improves lithographic overlay of the layer stack 110 of ON layers.

At operation 507, operation 503, optional operation 504, operation 505, and optional operation 506 are repeated until a desired number of material layer pairs 108 of the first material layer 104 of SiO$_2$ and the second material layer 106 of Si$_3$N$_4$ make up a layer stack 110. In one embodiment, 64 material layer pairs 108 make up the layer stack 110.

At operation 508, the substrate 102 is transferred to a RTP chamber 210a. In one embodiment, the second robotic arm 212 transfers the substrate 102 from the process chamber 214a of the PECVD system 208a to a RTP chamber 210a of the processing system 200. At operation 509, the layer stack 110 is annealed at an annealing temperature greater than about 800° C. Annealing at the annealing temperature greater than about 800° C. improves the residual uniformity of the layer stack 110 of ON layers by stress relaxation to minimize IPD and improve lithographic overlay. In one embodiment, IPD of the layer stack 110 of ON layers is reduced by 50 percent.

Figure 6:
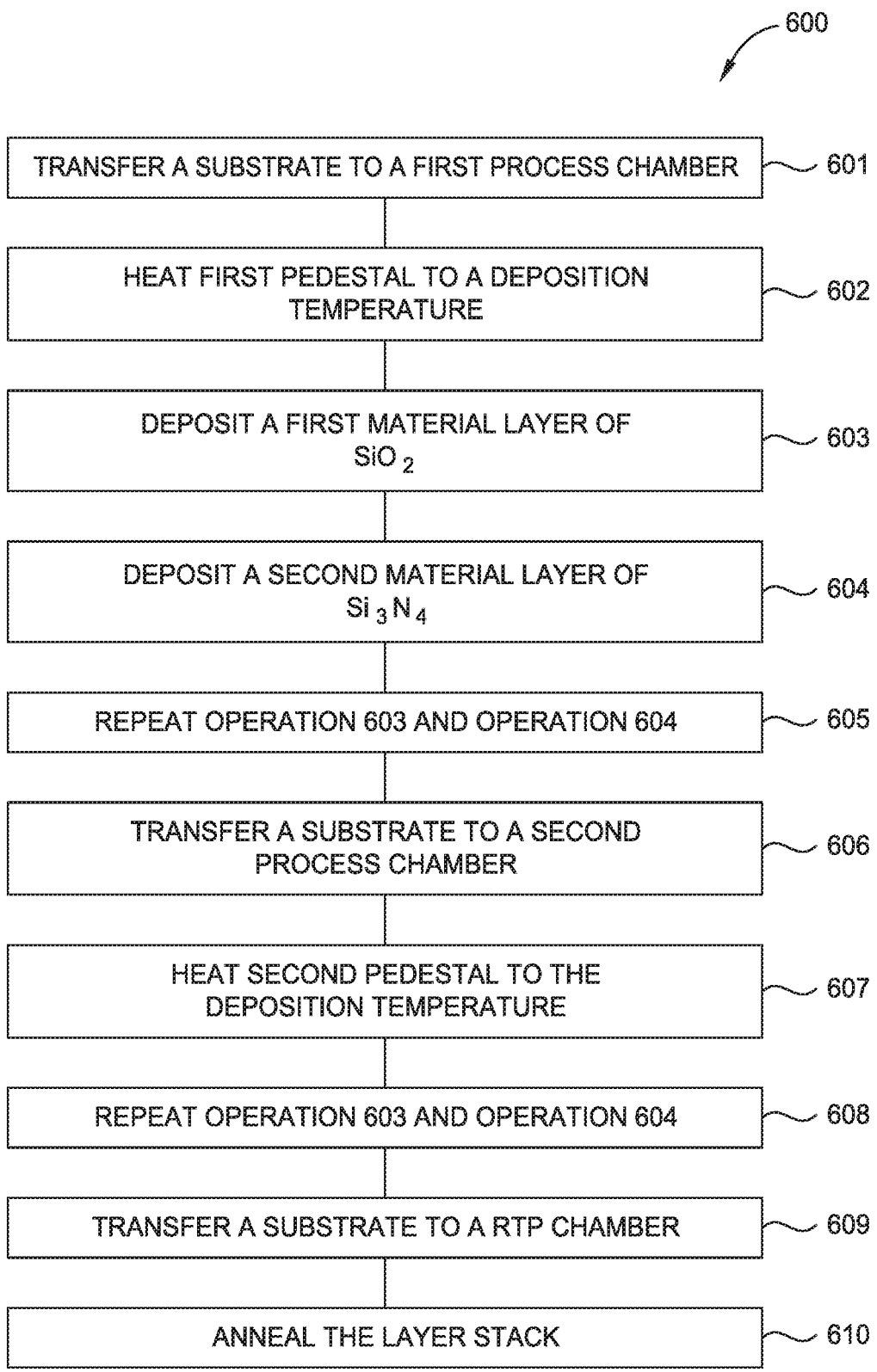
FIG. 6 is a flow diagram of a method of forming a layer stack of ON layers with minimized IPD and improved lithographic overlay according to an embodiment.

FIG. 6 is a flow diagram of a method 600 of manufacturing layer stacks of ON layers with minimized IPD and improved lithographic overlay. At operation 601 a substrate 102 is transferred to a process chamber 214a of a PECVD system 208a. At operation 602, the pedestal 309 is heated to a deposition temperature of about 550° C. to about 650° C. At operation 603, a first material layer 104 of silicon dioxide (SiO$_2$) is deposited. During operation 603, a first silicon-containing gas at a first silicon-containing gas flow rate, an oxygen-containing gas at an oxygen-containing gas flow rate, and a first dilution gas at a first dilution gas flow rate are delivered to the process chamber 214a. During the deposition of the first material layer 104 of SiO$_2$, a first RF power is applied symmetrically to the first silicon-containing gas, the oxygen-containing gas, and the first dilution gas. A symmetric application of the first RF power allows for deposition of the first material layer 104 of SiO$_2$ with improved residual uniformity to minimize IPD and improve lithographic overlay of the layer stack 110 of ON layers.

At operation 604, a second material layer 106 of silicon nitride (Si$_3$N$_4$) is deposited. During operation 604, a second silicon-containing gas at a second silicon-containing gas flow rate, a nitrogen-containing gas at a nitrogen-containing gas flow rate, and a second dilution gas at a first dilution gas flow rate are delivered to the process chamber 214a. The second dilution gas flow rate is selected to improve the residual uniformity of the second material layer 106 of Si$_3$N$_4$ and reduce IPD by 50 percent. In one embodiment, the second dilution gas is N$_2$ and the second dilution gas flow rate is greater than about 2000 sccm. During the deposition of the second material layer 106 of Si$_3$N$_4$, a second RF power is applied symmetrically to the second silicon-containing gas, the nitrogen-containing gas, and the second dilution gas. A symmetric application of the second RF power allows for deposition of the second material layer 106 of Si$_3$N$_4$ with improved residual uniformity to minimize IPD and improve lithographic overlay of the layer stack 110 of ON layers.

At operation 605, operation 603, depositing the first material layer 104 of SiO$_2$, and operation 604, depositing the second material layer 106 of Si$_3$N$_4$, are repeated until a first portion of a desired number of material layer pairs 108 of the first material layer 104 of SiO$_2$ and the second material layer 106 of Si$_3$N$_4$ that make up a layer stack 110 is deposited. In one embodiment, 64 material layer pairs 108 make up the layer stack 110 and the first portion of the desired number of material layer pairs 108 is 32 material layer pairs 108. In another embodiment, the substrate 102 is rotated 180° after half of the first portion of the desired number of material layer pairs 108 is deposited. Rotating the substrate 102 accounts for non-uniformity within the process chamber 214a to reduce the IPD of the layer stack 110. At operation 606, the substrate 102 is transferred to a process chamber 214b of a PECVD system 208a. In one embodiment, the second robotic arm 212 transfers the substrate 102 from the process chamber 214a of the PECVD system 208a to the process chamber 214b of a PECVD system 208a.

At operation 607, the pedestal 310 is heated to the deposition temperature of about 550° C. to about 650° C. Transferring the substrate 102 during the method 600 of forming a layer stack of ON layers allows for improved matching of IPD of the layer stack 110 formed on each pedestal of the process chambers 214a-214d for improved lithographic overlay. For example, the IPD of a layer stack 110 of ON layers formed in the process chamber 214a may be different the IPD of a layer stack 110 of ON layers formed in the process chamber 214b. Transferring the substrate 102 during the method 600 of forming a layer stack of ON layers averages the variation of IPD of the process chamber 214a and the process chamber 214b to match the IPD of the layer stack 110 formed in each process chamber.

At operation 608, operation 603, depositing the first material layer 104 of $SiO_2$, and operation 604, depositing the second material layer 106 of $Si_3N_4$, are repeated until a second portion of a desired number of material layer pairs 108 of the first material layer 104 of $SiO_2$ and the second material layer 106 of $Si_3N_4$ that make up a layer stack 110. In one embodiment, 64 material layer pairs 108 make up the layer stack 110 and the second portion of the desired number of material layer pairs 108 is 32 material layer pairs 108. In another embodiment, the substrate 102 is rotated 180° after half of the second portion of the desired number of material layer pairs 108 is deposited. Rotating the substrate 102 accounts for non-uniformity within the process chamber 214b to reduce the IPD of the layer stack 110. At operation 609, the substrate 102 is transferred to a RTP chamber 210a. In one embodiment, the second robotic arm 212 transfers the substrate 102 from the process chamber 214b of the PECVD system 208a to a RTP chamber 210a of the processing system 200. At operation 610, the layer stack 110 is annealed at an annealing temperature greater than about 800° C. Annealing at the annealing temperature greater than about 800° C. improves the residual uniformity of the layer stack 110 of ON layers by stress relaxation to minimize IPD and improve lithographic overlay. In one embodiment, IPD of the layer stack 110 of ON layers is reduced by 50 percent.

In summation, methods of manufacturing layer stacks of ON layer with minimized IPD and improved lithographic overlay and a showerhead configured to form a substantially uniform plasma are described herein. During the deposition of the first material layer of $SiO_2$ and the second material layer of $Si_3N_4$ RF power is applied symmetrically by the showerhead to the first silicon-containing gas, the oxygen-containing gas, and the first dilution gas. A symmetric application of the RF power allows for deposition of the first material layer of $SiO_2$ and the second material layer of $Si_3N_4$ with improved residual uniformity to minimize IPD and improve lithographic overlay of the layer stack of ON layers. The second dilution gas flow rate is selected to improve the residual uniformity of the second material layer of $Si_3N_4$ and reduce IPD. Transferring the substrate allows for differences of IPD of the layer stack formed on each pedestal of the process chambers to be eliminated for improved lithographic overlay. Annealing at the annealing temperature greater than about 800° C. improves the residual uniformity of the layer stack of ON layers by stress relaxation to minimize IPD and improve lithographic overlay.

While the foregoing is directed to examples of the present disclosure, other and further examples of the disclosure may be devised without departing from the basic scope thereof, and the scope thereof is determined by the claims that follow.

What is claimed is:

1. A method of forming a layer stack of oxide/nitride (ON) layers, comprising:
   transferring a substrate to a process chamber;
   heating a pedestal retaining the substrate to a deposition temperature;
   flowing a first silicon-containing gas at a first silicon-containing gas flow rate, an oxygen-containing gas at an oxygen-containing gas flow rate, and a first dilution gas at a first dilution gas flow rate into the process chamber;
   symmetrically applying a first radio frequency (RF) power to the first silicon-containing gas, the oxygen-containing gas, and the first dilution gas to form a first material layer of silicon dioxide ($SiO_2$);
   after forming the first material layer of $SiO_2$ discontinuing the flow of the first silicon-containing gas, and continuing the flow of the oxygen-containing gas and the flow of the first dilution gas while symmetrically applying the first RF power;
   flowing a second silicon-containing gas at a second silicon-containing gas flow rate, a nitrogen-containing gas at a nitrogen-containing gas flow rate, and a second dilution gas at a second dilution gas flow rate into the process chamber;
   symmetrically applying a second RF power to the second silicon-containing gas, the nitrogen-containing gas, and the second dilution gas to form a second material layer of silicon nitride ($Si_3N_4$);
   after forming the second material layer of $Si_3N_4$ discontinuing the flow of the second silicon-containing gas, and continuing the flow of the nitrogen-containing gas and the flow of the second dilution gas while symmetrically applying the second RF power; and
   repeating the flowing the first silicon-containing gas, the oxygen-containing gas, and the first dilution gas, the symmetrically applying the first RF power, the flowing the second silicon-containing gas, the nitrogen-containing gas, and the second dilution gas, and the symmetrically applying the second RF power until a desired number of material layer pairs of the first material layer and the second material layer make up a layer stack.

2. The method of claim 1, further comprising:
   transferring the substrate from the process chamber to a Rapid Thermal Processing (RTP) chamber; and
   annealing at an annealing temperature greater than about 800° C.

3. The method of claim 1, wherein the deposition temperature is about 500° C. to about 650° C.

4. The method of claim 1, wherein the first silicon-containing gas comprises at least one of silane ($SiH_4$), tetraethyl orthosilicate (TEOS), and disilane ($Si_2H_6$).

5. The method of claim 1, wherein the oxygen-containing gas comprises at least one of nitrous oxide ($N_2O$), oxygen gas ($O_2$), and trioxygen ($O_3$).

6. The method of claim 1, wherein the first dilution gas comprises at least one of nitrogen gas ($N_2$), argon (Ar), and helium (He).

7. The method of claim 1, wherein the second silicon-containing gas comprises at least one of $SiH_4$ and $Si_2H_6$, the nitrogen-containing gas comprises at least one of ammonia ($NH_3$) and $N_2$, and the second dilution gas comprises at least one of $N_2$, Ar, and He.

8. The method of claim 1, wherein the first silicon-containing gas flow rate is about 600 standard cubic centimeters per minute (sccm) to about 5000 sccm, the oxygen-containing gas flow rate is about 500 sccm to about 15000 sccm, and the first dilution gas flow rate is about 100 sccm to about 20000 sccm.

9. The method of claim 1, wherein the second silicon-containing gas flow rate is about 30 sccm to about 300 sccm, the nitrogen-containing gas flow rate is about 2000 sccm to about 7000 sccm, and the second dilution gas flow rate is about 500 sccm to about 3000 sccm.

10. A method of forming a layer stack of oxide/nitride (ON) layers, comprising:
   transferring a substrate to a first process chamber;
   heating a first pedestal of the first process chamber retaining the substrate to a deposition temperature;
   flowing a first silicon-containing gas at a first silicon-containing gas flow rate, an oxygen-containing gas at an oxygen-containing gas flow rate, and a first dilution gas at a first dilution gas flow rate into the first process chamber;
   symmetrically applying a first radio frequency (RF) power to the first silicon-containing gas, the oxygen-containing gas, and the first dilution gas to form a first material layer of silicon dioxide ($SiO_2$);
   after forming the first material layer of $SiO_2$ discontinuing the flow of the first silicon-containing gas, and continuing the flow of the oxygen-containing gas and the flow of the first dilution gas while symmetrically applying the first RF power;
   flowing a second silicon-containing gas at a second silicon-containing gas flow rate, a nitrogen-containing gas at a nitrogen-containing gas flow rate, and a second dilution gas at a second dilution gas flow rate into the first process chamber;
   symmetrically applying a second RF power to the second silicon-containing gas, the nitrogen-containing gas, and the second dilution gas to form a second material layer of silicon nitride ($Si_3N_4$);
   after forming the second material layer of $Si_3N_4$ discontinuing the flow of the second silicon-containing gas, and continuing the flow of the nitrogen-containing gas and the flow of the second dilution gas while symmetrically applying the second RF power;
   repeating the flowing the first silicon-containing gas, the oxygen-containing gas, and the first dilution gas, the symmetrically applying the first RF power, the flowing the second silicon-containing gas, the nitrogen-containing gas, and the second dilution gas, and the symmetrically applying the second RF power until a first portion of a desired number of material layer pairs of the first material layer and the second material layer make up a layer stack;
   transferring the substrate from the first process chamber to a second process chamber;
   heating a second pedestal of the second process chamber retaining the substrate to the deposition temperature; and
   repeating the flowing the first silicon-containing gas, the oxygen-containing gas, and the first dilution gas, the symmetrically applying the first RF power, the flowing the second silicon-containing gas, the nitrogen-containing gas, and the second dilution gas, and the symmetrically applying the second RF power until a second portion of the desired number of the material layer pairs of the first material layer and the second material layer make up the layer stack.

11. The method of claim 10, further comprising:
   transferring the substrate from the second process chamber to a Rapid Thermal Processing (RTP) chamber; and
   annealing at an annealing temperature greater than about 800° C.

12. The method of claim 10, wherein the deposition temperature is about 500° C. to about 650° C.

13. The method of claim 10, wherein the first silicon-containing gas comprises at least one of silane ($SiH_4$), tetraethyl orthosilicate (TEOS), and disilane ($Si_2H_6$).

14. The method of claim 10, wherein the oxygen-containing gas comprises at least one of nitrous oxide ($N_2O$), oxygen gas ($O_2$), and trioxygen ($O_3$).

15. The method of claim 10, wherein the first dilution gas comprises at least one of nitrogen gas ($N_2$), argon (Ar), and helium (He).

16. The method of claim 10, wherein the second silicon-containing gas comprises at least one of $SiH_4$ and $Si_2H_6$, the nitrogen-containing gas comprises at least one of ammonia ($NH_3$) and $N_2$, and the second dilution gas comprises at least one of $N_2$, Ar, and He.

17. The method of claim 10, wherein the first silicon-containing gas flow rate is about 600 standard cubic centimeters per minute (sccm) to about 5000 sccm, the oxygen-containing gas flow rate is about 500 sccm to about 15000 sccm, and the first dilution gas flow rate is about 100 sccm to about 20000 sccm.

18. The method of claim 10, wherein the second silicon-containing gas flow rate is about 30 sccm to about 300 sccm, the nitrogen-containing gas flow rate is about 200 sccm to about 7000 sccm, and the second dilution gas flow rate is about 500 sccm to about 3000 sccm.

19. The method of claim 10, wherein the second dilution gas is $N_2$ and the second dilution gas flow rate is greater than about 2000 sccm.

20. The method of claim 1, wherein an impedance on a tuning electrode of the pedestal is modulated after forming the first material layer of $SiO_2$ during the flow of the oxygen-containing gas and the flow of the first dilution gas with the flow of the first silicon-containing gas discontinued.

* * * * *